United States Patent [19]

Correa et al.

[11] Patent Number: 4,976,817

[45] Date of Patent: Dec. 11, 1990

[54] WET LAMINATION PROCESS AND APPARATUS

[75] Inventors: Jose L. Correa, Fullertown; Robert C. Stumpf, Orange; Charles L. Farnum, Riverside; Leo Roos, Laguna Beach, all of Calif.

[73] Assignee: Morton International, Inc., Chicago, Ill.

[21] Appl. No.: 282,174

[22] Filed: Dec. 9, 1988

[51] Int. Cl.$^5$ .............................................. B05C 1/08
[52] U.S. Cl. .................................... 156/555; 118/115; 118/249; 118/258; 118/259; 118/266; 118/602; 156/552; 156/578
[58] Field of Search ............... 118/266, 259, 602, 249, 118/258, 115, 117, 224; 156/522, 552, 578

[56] References Cited

U.S. PATENT DOCUMENTS

| | | |
|---|---|---|
| Re. 32,430 | 6/1987 | Sullivan . |
| 290,553 | 12/1883 | Edson . |
| 1,641,403 | 9/1927 | Van Derhoef . |
| 1,990,098 | 2/1927 | Seymour . |
| 2,271,801 | 2/1942 | Morrison et al. ............... 118/259 X |
| 2,759,825 | 8/1956 | Land . |
| 3,311,862 | 3/1967 | Rees . |
| 3,365,326 | 1/1968 | Conrad ............... 118/602 X |
| 3,498,263 | 3/1970 | DeToledo et al. ............ 118/259 X |
| 3,549,368 | 12/1970 | Collins et al. . |
| 3,607,544 | 9/1971 | Earner et al. . |
| 3,622,334 | 11/1971 | Matawan et al. . |
| 3,629,036 | 12/1971 | Isaacson . |
| 3,649,418 | 3/1972 | James . |
| 3,672,844 | 3/1974 | Flint ............... 118/602 X |
| 3,716,390 | 2/1974 | Garbarini . |
| 3,887,450 | 6/1975 | Gilano et al. . |
| 3,911,169 | 10/1975 | Lesaicherre et al. . |
| 3,959,567 | 5/1976 | Bradley . |
| 4,007,684 | 2/1977 | Takano et al. ............... 118/602 X |
| 4,008,352 | 2/1977 | Dawes et al. . |
| 4,069,076 | 1/1978 | Fickes . |
| 4,268,610 | 5/1981 | Roos . |
| 4,293,635 | 10/1981 | Flint et al. . |
| 4,389,480 | 7/1982 | Franke et al. . |
| 4,395,968 | 8/1983 | Wahnschaff ............... 118/602 |
| 4,405,394 | 9/1983 | Cohen . |
| 4,464,221 | 8/1984 | Garber . |
| 4,497,890 | 6/1984 | Helbert . |
| 4,524,126 | 6/1985 | Marinace et al. . |
| 4,548,884 | 8/1985 | Heiart . |
| 4,657,839 | 4/1987 | Sullivan . |
| 4,659,419 | 5/1987 | Miyake . |
| 4,672,020 | 6/1987 | Koelsch et al. . |
| 4,693,959 | 9/1987 | Ashcraft . |
| 4,698,284 | 10/1987 | Cronin . |
| 4,698,294 | 10/1987 | Lau et al. . |
| 4,743,325 | 5/1988 | Miyake . |
| 4,773,136 | 9/1988 | Seydel et al. ............... 118/266 X |

FOREIGN PATENT DOCUMENTS

| | | |
|---|---|---|
| 0123158 | 10/1984 | European Pat. Off. . |
| 0256986 | 8/1986 | European Pat. Off. . |
| 0259853 | 3/1988 | European Pat. Off. . |

OTHER PUBLICATIONS

Technical Paper No. IPC-TP-561, "Optimizing Dry Film Photoresist Lamination for Fine Line Innerlayers", Ripsom and Wopschall (DuPont) Sep./Oct., 1985, presented at IPC Fall Meeting in Los Angeles, CA.

*Primary Examiner*—David Simmons
*Attorney, Agent, or Firm*—Gerald K. White

[57] ABSTRACT

Apparatus for wet laminating a photopolymerizable film onto circuit board panels or other substrates. The apparatus is easily and quickly convertible from dry laminating to wet laminating with the rollers therefor mounted in bearing blocks which are insertable in slots in brackets at each end and removable therefrom. The lower roller thereof has a gear the teeth of which are meshable with the teeth of an idler gear for transmission of rotation power thereto. Elongate tubes for applying a fluid, which comprises between about 0.1 and about 10 wt. % of a heterocyclic metal-chelating agent, to the wet insertion rollers for application thereof to the panels are contained in a yoke which is adjustable next to wet insertion rollers for wet laminating or away from dry insertion rollers for dry laminating. The flow rate of fluid to the elongate tubes is controlled, and excess fluid applied to the wet insertion rollers is collected in a tray and returned to the system in order to prevent waste and undesirable environmental effects.

17 Claims, 9 Drawing Sheets

WET LAMINATION PROCESS AND APPARATUS

The present invention relates generally to a process and apparatus for laminating a photopolymerizable film, sometimes called photoresist, onto a substrate such as a copper panel for the manufacture of circuit boards and the like. More particularly, the present invention relates, to such a process and apparatus wherein a liquid is introduced at the photoresist/substrate interface.

When laminating dry film photoresist onto panels or substrates with irregular surfaces such as copper laminate with heavy basket weave surface caused by a fiberglass or polyimide dielectric material sandwiched between the copper layers, air may become trapped between the photoresist and the substrate. Such air entrapment on fine-line circuit patterns may result in broken lines and rejected panels. Fluid may be applied to the surfaces of the panel or substrate in accordance with a wet lamination process in order to interact with the photopolymer and improve the flow characteristics thereof for conformation of the photopolymer, which may be of various thicknesses, to the irregular surfaces without air entrapment so that greater yields may result.

Various proposals have been made for applying a liquid between the photoresist and substrate for circuit boards. For example, U.S. Pat. No. 3,629,036 to Issaacson discloses a method wherein a uniform coating of liquid adhering agent containing at least a small amount of dissolved resist and being compatible with eventual exposure and development of the photoresist layer is applied to the surface of a substrate before lamination. U.S. Pat. No. 4,698,294 to Lau et al discloses a process for lamination of a photopolymerizable film onto a substrate which employs an intermediate nonphotosensitive liquid which is substantially all monomer. U.S. Pat. No. 4,069,076 to Fickes discloses a process of applying a photoresist film to a preimaged patterned relief substrate wherein the substrate is flooded with a swelling agent prior to the application of the film. Excess swelling agent is squeezed off the substrate surface during lamination. An absorbent carrier is present below the laminate to soak up the swelling agent.

Heretofore, wet laminating processes have suffered from several disadvantages. Sometimes it is desirable to convert to a dry lamination process. For example, for through-hole panels, it is desirable not to get liquid in the holes since the liquid may expand when heated to outgas and lift the photoresist from around the holes. Thus, it is desirable to be able to convert easily on the same machine between wet and dry lamination. For wet lamination, liquid may be applied by a pair of rollers which have absorbent material on the periphery thereof. However, rollers for laminating machines are conventionally installed in such a manner that it is difficult to remove and replace them in that, although the upper roller may on some machines be relatively easy to remove, removal of the lower roller may require its disassembly from the bearing which is permanently attached to the support structure as well as disassembly of separators which maintain the brackets therefor in position and also may require disassembly of a transmission mechanism from its sprocket wheel. Such a disassembly and re-assembly process may undesirably require several hours during which lamination cannot occur.

It is therefore an object of the present invention to provide easy conversion between wet lamination and dry lamination without the need for special tools or complicated procedures and without substantial downtime on the laminator to thereby provide the flexibility for laminating wet or dry as may be required.

It is another object of the present invention to control the fluid flow during the wet laminating process so as to minimize the amount of excess fluid applied to the substrate.

It is yet another object of the present invention to prevent waste of fluid which may be applied in excess to the substrate so as to realize cost savings and environmental benefits.

In order to achieve the above objects in accordance with the present invention, a pair of upper and lower panel insertion rollers are installed, as will be described hereinafter in the detailed description, so that each of them may be easily lifted vertically out of a slot in a slotted housing for conversion between wet and dry lamination or for replacement and means are provided, as will also be described in detail hereinafter, for controlling the amount of fluid supplied to the wet insertion rollers and for recirculating excess fluid.

The above and other objects, features, and advantages of this invention will be apparent in the following detailed description of the preferred embodiments thereof which is to be read in connection with the accompanying drawing.

DETAILED DESCRIPTION OF THE PREFERRED EMBODIMENTS

Figure 1:
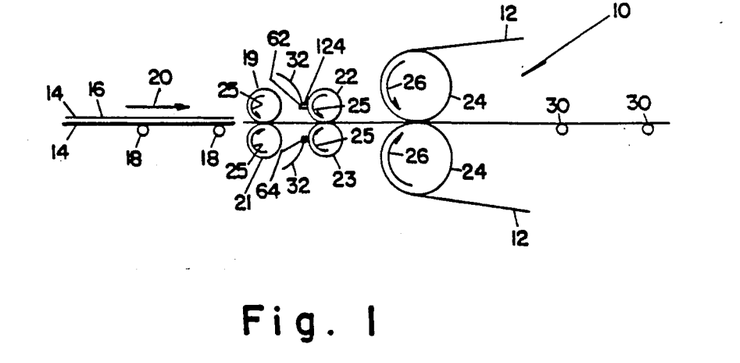
FIG. 1 is a diagrammatic view illustrating the process of wet lamination.

Referring to FIG. 1, there is illustrated apparatus at 10 and a method for laminating a photopolymerizable film, illustrated at 12, onto one or both surfaces 14 of a substrate 16. The substrate 16 may typically be a circuit board or panel comprising a pair of thin layers of copper having a thickness of typically 0.0006 to 0.0017 inch with a resin impregnated dielectric material such as fiberglass or polyimide having a thickness of typically 0.004 inch sandwiched therebetween. The photopolymerizable film, sometimes called photoresist dry film may, for example, be similar to that disclosed in U.S. Pat. No. 3,887,450, which is incorporated herein by reference, and which was granted to Michael N. Gilano et al and is assigned to Dynachem Corporation, 2631 Michelle Drive, Tustin, Calif. 92680, now a division of Assignee.

Figure 2:
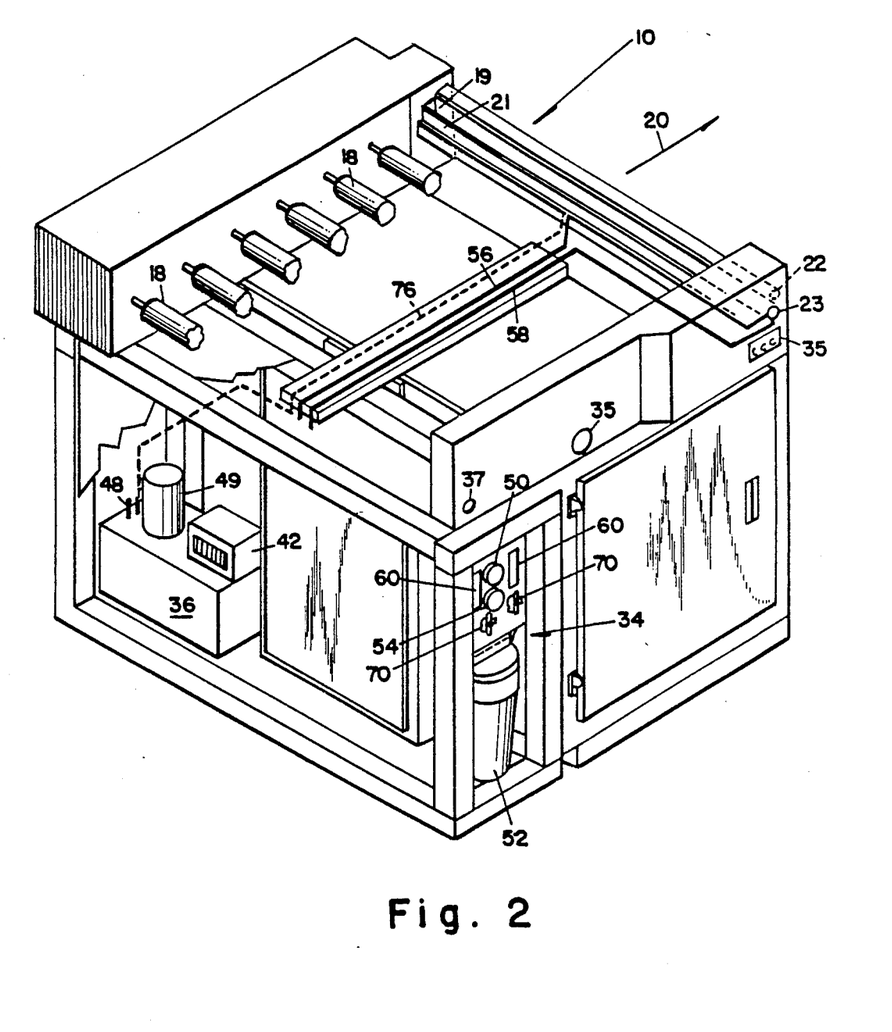
FIG. 2 is a perspective view of a portion of the apparatus which embodies the present invention with portions of the conveyor rolls broken away in order to illustrate fluid flow lines which are schematically illustrated.

The machine feed inlet may comprise two or more elongate horizontal parallel inlet conveyor rollers 18, such as, for example, six rollers as shown in FIG. 2, over which the panels 16 are fed in the direction illustrated at 20.

The panels 16 are then fed through two pairs of driven elongate horizontal parallel insertion rollers, the first pair 19 and 21 being superposed with roller 19 above roller 21, and the second pair 22 and 23 also being superposed with roller 22 above roller 23. The rollers of each pair rotate in opposed directions as illustrated at 25. A single pair of rollers may be sufficient if adequate friction for panel insertion is achievable therewith. On the other hand, more than two pairs of such insertion rollers may be necessary. Thus, the present invention is not limited to any particular number of pairs of such insertion rollers.

The panels 16 are thereafter inserted by rollers 19, 21, 22, and 23 between a pair of superposed horizontal hot laminating rolls 24 which rotate in opposed directions illustrated at 26 to apply the photoresist film 12 to the surfaces 14 thereof. With the film 12 attached thereto, the panels 16 are then carried away over one or more parallel elongate horizontal conveyor rollers 30.

Apparatus as described herein may be provided as a module or kit for attaching to an existing laminator so that it may be converted for wet lamination. An example of a laminating machine which may be adapted in accordance with the present invention is shown in U.S. Pat. No. 4,702,789 to Ceraso which patent is incorporated herein by reference and which is assigned to the assignee of the present invention. Another example of a laminating machine which may be adapted in accordance with the present invention is described in U.S. Pat. Nos. 4,743,325 and 4,659,419 to Miyake and assigned to Hakuto Co., Ltd. of Tokyo, Japan and which patents are incorporated herein by reference. The present invention can be used on both automatic and manually fed machines. The Ceraso and Miyake patents discuss the lamination process and apparatus in greater detail. The process and apparatus for dry lamination is commonly known to those of ordinary skill in the art to which this invention pertains. The present specification describes improvements in such apparatus for wet laminating.

Figure 16:
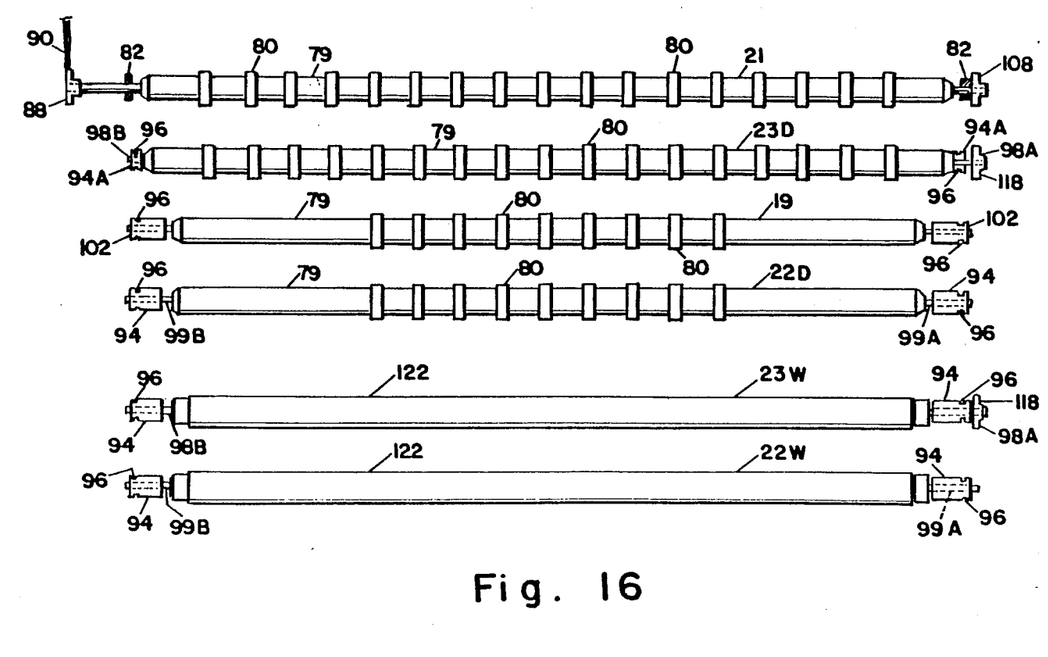
FIG. 16 is a longitudinal view of each of a kit of insertion rollers usable for wet and dry laminating in accordance with the present invention.

The woven surface of the dielectric material between the copper layers of the panels 16 may result in irregular surfaces 14 which during dry film lamination may result in voids having a depth of perhaps up to 15 to 18 microns between the dry film and the panel surfaces 14 which undesirably trap air therein to cause nicks and opens in the finished circuit boards. In order to provide conformation of the film 12 to the surfaces 14 so that air may not be trapped therebetween, it has been found that a fluid provided to the panel surfaces 14 prior to lamination may displace the air from the voids as well as soften the resist or otherwise cause it to conform to the surfaces 14. Such a process of applying a fluid to the panel surfaces 14 prior to lamination is called herein wet lamination. In order to convert the apparatus 10 from a dry laminator to a wet laminator, insertion rollers 22 and 23 must be removed and replaced with a pair of insertion rollers suitably having fluid absorbent coverings 122 which will allow a controlled even distribution of fluid to the panels 16, as will be described in greater detail hereinafter, and fluid must be supplied to the coverings 122 during the laminating process by suitable means such as illustrated at 32. For convenience, the second pair of rollers 22 and 23 may be referred to herein as wet insertion rollers or dry insertion rollers, it being understood that they are interchangeable but constructed differently. The dry insertion upper and lower rollers of the second pair are shown in FIG. 16 at 22D and 23D respectively, while the wet insertion upper and lower rollers are shown in FIG. 16 at 22W and 23W respectively. In accordance with the present invention, the first pair of rollers 19 and 21 as well as any other pairs of insertion rollers which may be provided may be conventional dry insertion rollers and need not be interchangeable for wet laminating, but may be referred to hereinafter for convenience as pinch rollers to distinguish them from the interchangeable insertion rollers 22 and 23. There may, if desired, be one or more pairs of pinch rollers between the insertion rollers 22 and 23 and the hot laminating rolls 24. Thus, the positions of the pinch and insertion rollers may be interchangeable to accommodate various surface conditions.

Figure 3:
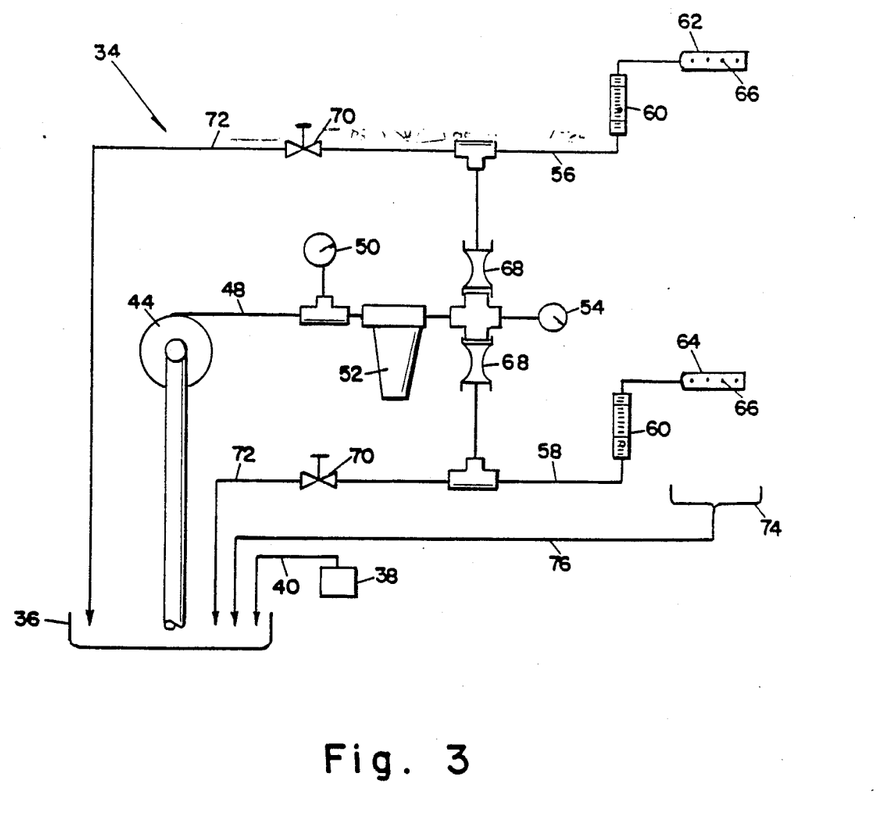
FIG. 3 is a more detailed diagrammatic view of the fluid flow lines for the apparatus shown in FIG. 2.

In order that all areas of the panel surfaces 14 be completely covered during wet lamination, it is necessary that the quantity of fluid applied to the panels 16 be equal or greater than the minimum required for the process. Thus, a measured excess amount of fluid is required, but the amount of excess should be minimized as much as possible. Excess fluid may fall from the panels on to various surfaces of the laminator 10, the dry film 12, and the floor. The surface tension of fluid on the dry film 12 undesirably tends to interfere with its detachment from the vacuum platens (not shown) after the film is tacked to the panel. Depending upon the composition of the fluid, such a waste of fluid may also be costly and may be environmentally undesirable, for example, waste treatment may be required. In order to prevent such undesirable effects in accordance with the present invention, the fluid flow to the wet insertion rollers 22W and 23W is controlled, and excess fluid is filtered and recirculated. Referring to FIGS. 2 and 3, there is shown generally at 34 an hydraulic system for controllably supplying fluid to the rollers 22W and 23W and for recirculating any excess fluid in order to prevent waste of fluid and to prevent undesirable environmental effects in accordance with the present invention. In FIG. 2, the portion of the apparatus 10 which contains the inlet conveyor and insertion rollers is shown with portions of the inlet conveyor rollers 18 removed so as to better show the routing of hydraulic lines. At 35 are shown various conventional controls for the laminating equipment, and at 37 is shown an emergency stop. At 36 is shown a fluid reservoir which is supplied with fluid from a fluid supply 38 through line 40. A suitable level control (not shown) extends into the reservoir 36 and is electrically connected at electrical terminal box 42 with conventional means (not shown) for maintaining a desired level in the reservoir 36 through make-up from storage 38.

A pump 44, which may be submerged, transfers the fluid in the reservoir 36 through line 48 which contains pressure gauge 50 to a suitable filter 52, such as, for example, a diatomaceous earth cartridge filter, where the fluid is suitably filtered to maintain a desired quality thereof and to remove particles such as fiberglass slivers, dust, dirt, and the like which may otherwise clog small diameter passages in the fluid delivery system as will be described in greater detail hereinafter. A filter pressure gauge 54 is provided at the outlet of the filter 52 so that the differences in pressure before and after the filter 52 may be compared to determine whether or not the filter needs to be cleaned.

After passing through the filter 52, the line 48 is split into a branch 56 to supply fluid to the upper wet insertion roller 22W and a branch 58 for supplying fluid to the lower wet insertion roller 23W, each branch having typically a ¼ inch outside diameter. A rotameter or other suitable flowmeter 60 is contained in each of the lines 56 and 58 to provide a visible means for monitoring the regulation of the fluid to an optimum amount which may vary with panel length. The fluid is delivered through lines 56 and 58 to upper and lower tubes 62 and 64 respectively which extend longitudinally over the length of the respective wet insertion rollers 22W and 23W and each of which has a plurality of apertures 66 spaced over the length thereof as described in greater detail hereinafter for release of fluid onto the respective wet insertion rollers 22W and 23W, as illustrated at 124 in FIGS. 11 and 15.

In order to prevent an undue amount of fluid delivery to the wet insertion rollers 22W and 23W, it is preferable that the flow rate be maintained at a predetermined sufficiently low level such as perhaps 1 to 10 cubic centimeters per minute. In order to achieve such a low flow rate, it is necessary to maintain a low pressure in lines 56 and 58 which may be provided by restrictions 68 which are sized to have a measured head loss based on the pump pressure and the desired flow rate. For example, the restrictions 68 may have a diameter of 0.022 inch over a length of 0.5 inch in order to provide a measured head loss. In order to maintain a constant desired flow rate, conventional metering valves 70, which may be manually or automatically operated, are provided for bypassing fluid from lines 56 and 58 back to the reservoir 36 through lines 72, which may typically have a ⅜ inch outer diameter.

In order that a variance in pressure in the line for one of the fluid delivery tubes 62 or 64 does not effect the flow in the line for the other fluid delivery tube, the pump 44 is preferably a centrifugal pump or other suitable pump which provides constant pressure, such as, for example, a ⅛th horsepower pump providing about 10 to 13 psi.

In order to evenly distribute the fluid along the length of each of the wet insertion rollers 22W and 23W, which may be perhaps 24 inches long, the plurality of apertures 66 are sized to have a diameter of perhaps 0.01 to 0.02 inch and are spaced about 1.5 to 2 inches apart for about 10 to 12 apertures 66 in each of the upper and lower tubes 62 and 64 respectively. Tubes 62 and 64 should be sufficiently large to provide a low flow velocity therein. Thus, the inner diameter of each of the tubes 62 and 64 may perhaps be about ⅛ inch.

In order to prevent excess fluid applied to the wet insertion rollers 22W and 23W from falling onto other parts of the laminating apparatus or floor, in accordance with this invention a tray 74 is suitably disposed under the rollers 22 and 23 and tubes 62 and 64, as best shown in FIGS. 8 to 11. The excess fluid is then drained back to the reservoir 36 through drain line 76' which may, for example, have an inner diameter of perhaps 0.5 inch.

In order to provide a more even flow of fluid out of the apertures 66, a greater number of apertures spaced closer together may be provided near the end of the delivery tube that receives the fluid. For example, over the first 12 inches from the fluid inlet, illustrated at 132 in FIG. 4, the apertures 66 may be spaced approximately 1.5 inches apart, while over the latter 12 inches of length the apertures may be spaced approximately 2 inches apart.

Figure 13:
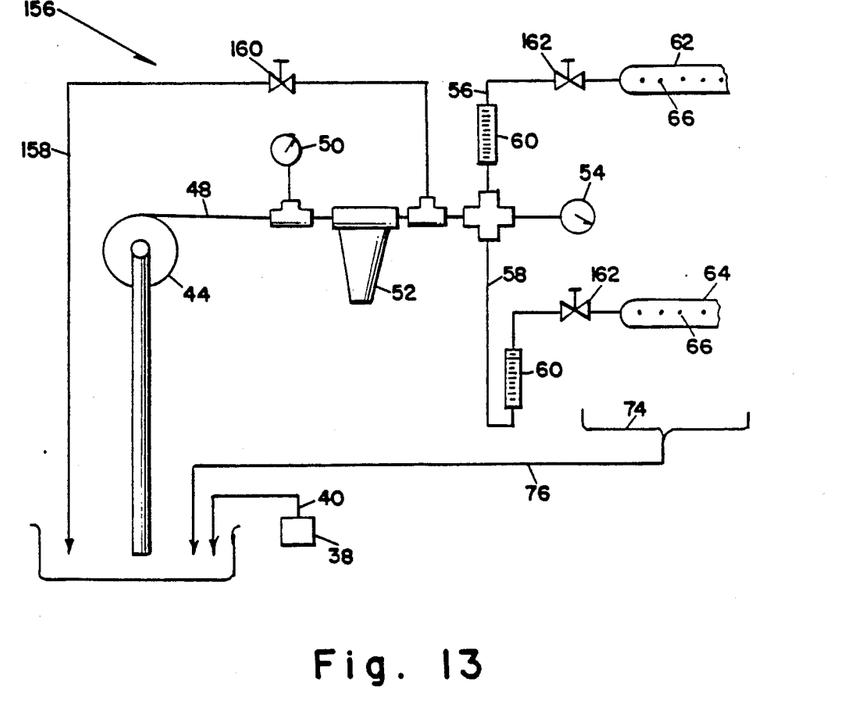
FIG. 13 is a view similar to that of FIG. 3 illustrating an alternative embodiment of the fluid flow lines.

The constant pressure provided by pump 44 and the measured head loss provided by restrictions 68 allow a small pressure of perhaps 20 inches of water in each of the lines 56 and 58. The flow rates through the lines 56 and 58 measured by flowmeters 60 may then be adjusted by regulating the bypass of fluid through valves 70 back to the reservoir. The particular optimum flow rates will vary from machine to machine and is particularly dependent on panel length and may be determined in accordance with principles commonly known to those of ordinary skill in the art to which this invention pertains to obtain the optimum flow rate for a particular application, that is, a flow rate which is sufficient to adequately wet the panels 16 to provide conformation of the photoresist to the surfaces thereof but which allows a minimum of excess fluid to be applied to the panels 16. It is envisioned that provisions may also be made for chemical adjustment, heating, cooling, and other conditioning of the fluid. An alternative fluid delivery system is illustrated at 156 in FIG. 13 wherein constant pressure pump 44 discharges through a filter 52 and the pump discharge line branched into lines 56 and 58 similarly as shown in FIG. 3. However, unlike the embodiment of FIG. 3, a single by-pass or relief line 158 containing a pressure regulation metering valve 160, which may be manually or automatically operated, branches from the discharge line uPstream of the branch lines 56 and 58 to maintain a desired pressure of perhaps 10 to 13 psi in lines 56 and 58. Instead of the restrictive Passages shown in FIG. 3, suitable needle valves 162 are provided in branch lines and 58 to allow sufficient back pressure for more stable fluid flow at a low flow rate of perhaps 1 to 10 cubic centimeters per minute.

Figure 4:
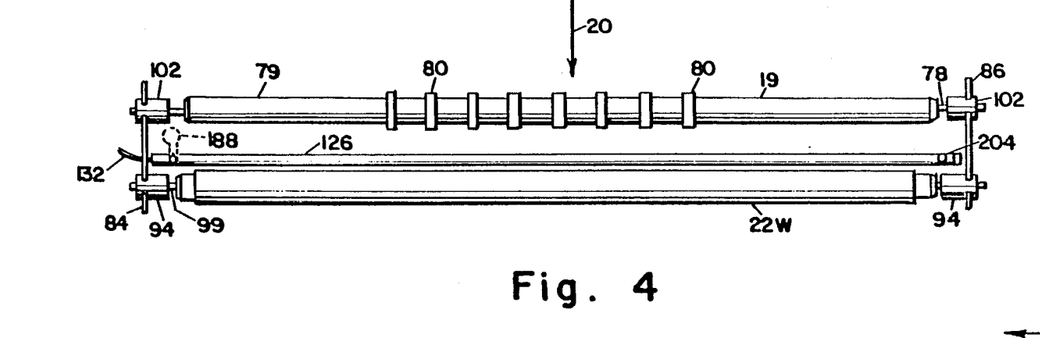
FIG. 4 is a plan view of a portion of the apparatus shown in FIG. 2 containing the upper pinch and insertion rollers thereof.

Referring to FIG. 4, there is shown the portion of the apparatus 10 which contains the upper pinch roller 19 and the upper wet insertion roller 22W. The panels 16 pass in the direction illustrated at 20 between the upper and lower pinch rollers 19 and 21 respectively, after-which they pass between the upper and lower wet insertion rollers 22W and 23W respectively. The pinch rollers 19 and 21 are each composed of a shaft 78 which is enlarged over the central portion of its length, as illustrated a 79, as are the dry insertion rollers 22D and 23D, upon which enlarged portion is disposed at spaced intervals a plurality of disks 80 which are held in place by snap rings (not shown) and are composed of a suitable material such as antistatic rubber for passing the panels 16 therethrough. As shown in FIG. 16, the disks 80 for lower roller 21 as well as for lower dry insertion roller 23D are spaced evenly over the entire lengths thereof while disks 80 for upper roller 19 as well as for upper dry insertion roller 22D are spaced only over the central portions thereof with the axially outer portions free of rolls. As shown in FIG. 16, rollers 19 and 22D may be identical and therefore interchangeable.

Referring to FIG. 16, each end of the shaft 78 for the lower pinch roller 21 is mounted in a bearing 82 which is permanently mounted in a respective bracket 84 and 86. One end of the shaft 78 for the lower pinch roller 21 extends beyond the respective bearing 82 and is attached to a sprocket wheel 88. The sprocket wheel 88 is connected by a sprocket chain 90 to a source of power (not shown) such as a motor for rotation of the lower pinch roller 21. The lower pinch roller 21 is thus permanently mounted in the brackets 84 and 86. Thus, removal of the lower pinch roller 21 would require disassembly of the bearings 82 from the brackets 84 and 86 as well as disassembly of separators (not shown) which maintain the brackets in position and would thus undesirably require a considerable amount of down time.

In order to provide for easy and quick removal of the insertion rollers 22 and 23 and replacement thereof for convertibility between dry and wet laminating in accordance with the present invention, a vertical slot 92 is provided in the upper surface 91 of each of the brackets 84 and 86. Each of the slots 92 is sized to receive a bearing block 94 therein in which is rotatably mounted in aperture 100 the respective end portion 98A and 98B of the shaft 98 of the lower insertion roller 23. Each bearing block 94, which may be composed of bronze or other suitable material, is inserted in the respective vertical slot 92 with grooves 96 on opposite sides of the bearing block 94 receiving edge portions of the slot 92 of the respective bracket 84 and 86. Each slot 92 is positioned in the respective bracket and its depth determined and the grooves 96 positioned on the bearing blocks 94 in order to precisely position the bearing blocks 94. The upper insertion roller 22, which has shaft 99 having first and second shaft end portions 99A and 99B respectively, is mounted in similar bearing blocks 94 which are also received in the slots 92, and the upper insertion roller 22 is allowed to float or rest by gravity on the lower insertion roller 23 to rotate therewith by friction as the lower insertion roller 23 rotates for movement of panels 16 therebetween.

Upper pinch roller 19 is mounted in bearing blocks 102, similar to bearing blocks 94, which are received in vertical slots 104, similar to slots 92, in the upper surfaces 91 of brackets 84 and 86 and allowed to float or rest by gravity upon lower pinch roller 21 for rotation by friction as the lower pinch roller 21 rotates for movement of panels 16 therebetween. The bearing blocks 94 and 102 may have any other suitable shape than that shown such as, for example, cubical. As shown in FIG. 16, the bearing blocks 94A for roller 23D are suitably shorter than the other bearing blocks.

Figure 9:
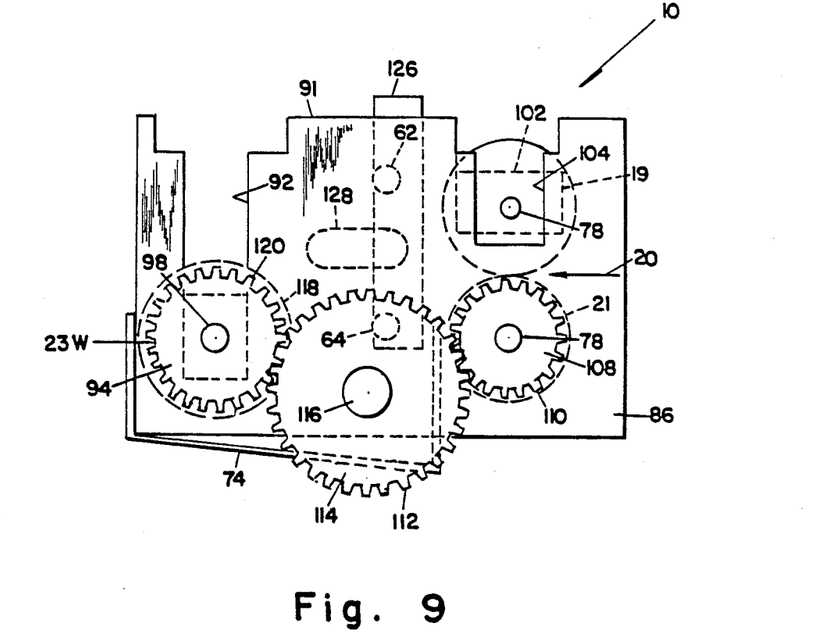

As seen in FIG. 9, there is a substantial distance between the lower rollers 21 and 23. The use of a sprocket chain for transferring power from roller 21 to roller 23 for rotation thereof would also require difficult disassembly procedures which would result in undesirable down time for conversion between dry and wet laminating. In order to eliminate the requirement of disassembly of a sprocket chain in accordance with the present invention, the shaft for the lower pinch roller 21 is caused to extend outwardly from the bracket 86 and is provided with a spur gear 108 which has teeth 110 which mesh with teeth 112 of an idler gear 114 which is mounted to bracket 86 by suitable means such as shaft 116. The shaft 98 for lower insertion roller 23 also extends outwardly beyond the bracket 86, and a spur gear 118, which has teeth 120, is mounted thereon. The idler gear 114 is suitably positioned so that its teeth 112 mesh with the teeth 110 of gear 108 and with teeth 120 of gear 118 to transfer rotational motion to the lower insertion roller 23 for rotation thereof. Idler gear 114 may thus be referred to in this specification and the claims as a driving gear, and gear 118 may be referred to as a driven gear. The idler gear 114 is positioned with its axis lower than the axis of gear 118 so that gear 118 can be moved up and away from gear 114 for removal of insertion roller 23. Gears 108 and 118 are sized, in accordance with principles commonly known to those of ordinary skill in the art to which this invention pertains, for rotation at the same speed. By gear, as that term is used in this specification and claims, is meant a mechanism for transferring power which has teeth which mesh with teeth of another mechanism but which is not otherwise connected to the other mechanism. A gear is therefore distinguished from a sprocket wherein a sprocket chain is attached to the power transmitting mechanisms and thus requires removal of the sprocket chain before removal of either of the mechanisms. Thus, because lower insertion roller 23 is provided with gear 118 whose teeth 120 mesh with teeth 112 of an idler gear 114 and is not otherwise connected thereto, lower insertion roller 23 may be inserted into the slot 92 and removed therefrom without any disassembly of a sprocket chain and by merely engaging and disengaging the gear teeth.

As previously stated, the cylindrical surfaces of the rollers 22 and 23 for dry lamination may be fitted with disks 80 of a suitable material such as antistatic rubber. For wet lamination, these rollers 22D and 23D must be replaced with a set of rollers, shown at 22W and 23W in FIG. 16, which have on their outer surfaces the fluid absorbent coverings 122 for applying a controlled even distribution of fluid to the panel surfaces 14 as the panels 16 are passed horizontally therebetween. Thus, the wet insertion rollers 22W and 23W are provided, for wet lamination, with a suitable material 122, in the shape typically of a sock, on their outer surfaces for fluid absorption such as, for example, a cotton material or a non-linting terrycloth material. Examples of suitable materials include a dampener cover for a duct or roller developed for A. M. Duplicators, manufactured by A. M. Multigraphics of Mount Prospect, Ill., a division of A. M. International, Inc. Relative thereto, reference may be made to U.S. Pat. No. 4,043,142 which is incorporated herein by reference. Another example is a red 1RF21 dampener cover by the Kendall Co. of Walpole, Me. Relative thereto, reference may be made to U.S. Pat. No. 4,531,386 which is incorporated herein by reference. Another example is a dampener material called Greensleeves material distributed by Jomac Inc. of Warrington, Pa.

In accordance with a preferred embodiment of the present invention, the cover 122 may be composed of two or more layers of different material, for example, an inner terrycloth-like material for absorbency and an outer fine weave material of cotton or the like to provide more even distribution of the fluid, and the materials may be adjusted for optimum conditions.

Figure 11:
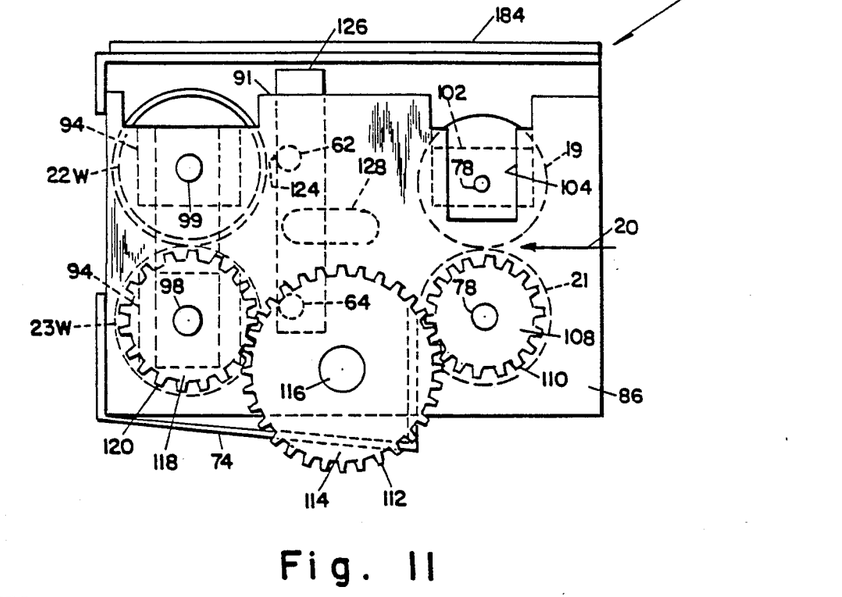

As best shown in FIG. 11, the fluid is applied to the rollers 22W and 23W from the tubes 62 and 64 which release fluid, as illustrated at 124, thereon through apertures 66 spaced along the length thereof. The tubes 62 and 64 are disposed within a yoke member 126. As described in greater detail hereinafter, the yoke 126 is adjustable relative to its distance from the rollers 22 and 23. Fluid 124 discharged from the pump 44 is directed to one end of tubes 62 and 64 such as illustrated at 132 in FIG. 4. The tubes 62 and 64 may be composed of stainless steel or other suitable material.

Figure 15:
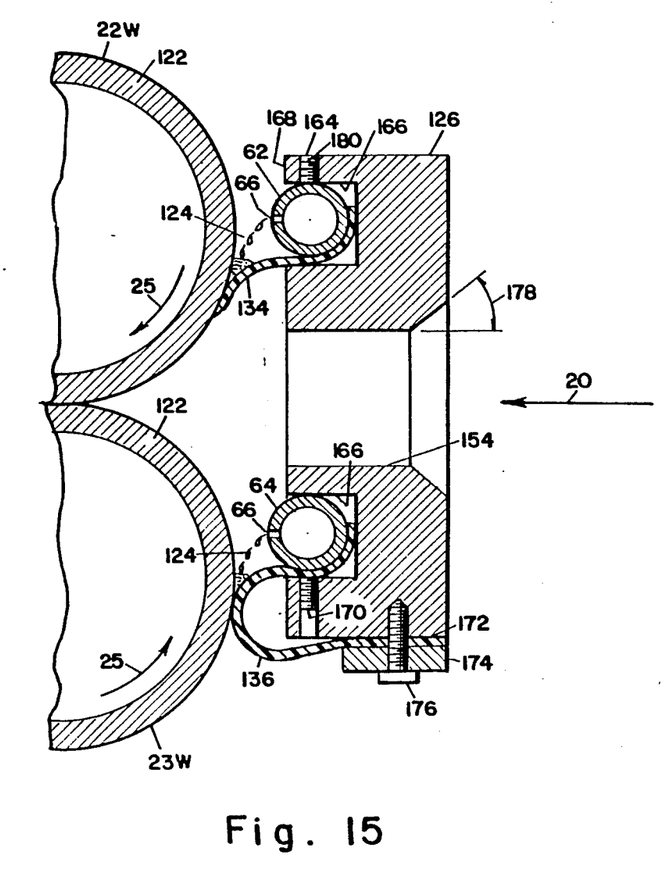
FIG. 15 is a detail view illustrating the application of fluid onto the wet insertion rollers in accordance with the present invention.

As shown in FIG. 15, wiper membranes 134 and 136, having a thickness of perhaps 0.005 inch and composed of plastic or Teflon ® material or other suitable material, are preferably attached to the yoke 126 to contact the respective wet insertion rollers 22W and 23W in order to apply and more evenly spread the fluid 124 thereover. Teflon is a trademark of E. I. duPont de Nemours and Company of Wilmington, Del. The upper and lower fluid delivery tubes 62 and 64 are disposed in slots 166 in the vertical surface 168 of the yoke 126 which faces the wet insertion rollers 22W and 23W. The upper wiper 134 is also disposed in the respective slot 166 for the upper tube 62, wraps partially around tube 62, and is held in place by a series of perhaps six set screws 164, spaced over the length of the yoke and received in threaded apertures 180, which pinch the wiper 134 between the tube 62 and the lower slot surface. The upper wiper 134 is suitably sized to terminate at an end portion against which the upper wet insertion roller 22W rubs to evenly distribute the fluid 124 across the surface thereof. The lower wiper 136 similarly partially wraps around the lower plenum tube 64 and is held in place by a series of perhaps six set screws 170 spaced over the length of the yoke which pinch the wiper 136 between the set screws 170 and tube 64 and with the wiper 136 and tube 64 pinched between the set screws 170 and the upper slot surface. The lower wiper 136 also extends out of the slot 166 to engage lower wet insertion roller 23W to similarly evenly distribute the fluid 124 across the surface thereof. However, in order to preclude the possibility of the lower wiper 136 being switched up by the friction of the cover 122 as the lower insertion roller 23W rotates, the lower wiper 136 is bent around to terminate at an end portion 172 which is secured between the lower surface of the yoke 126 and a plate 174 by a series of perhaps four bolts 176 spaced along the length thereof.

A passageway 154 is provided centrally of the yoke 126 for passage of panels 16. The entrance to the passageway 154 is funneled, i.e., flared at an angle, illustrated at 178, of perhaps 45 degrees to ease the passage of the panels 16.

In accordance with an alternative embodiment, it is envisioned that the rollers 22 and 23 may be wetted by an internal induction of fluid or by any other suitable means.

Figure 5:
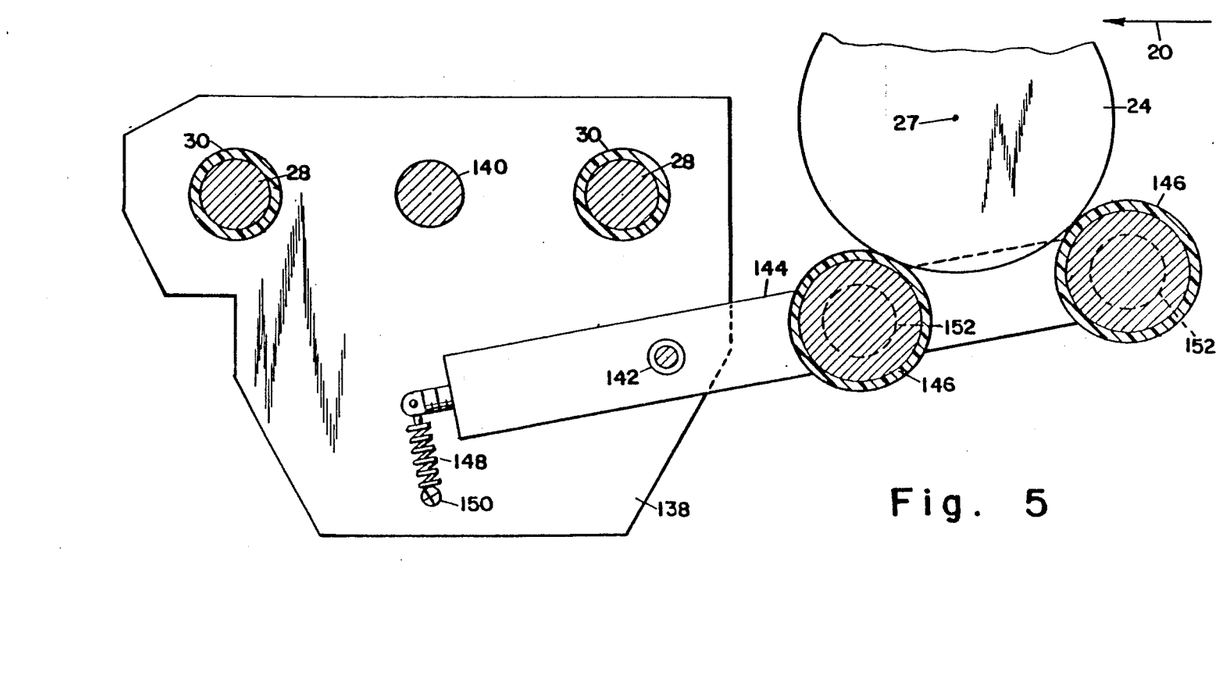
FIG. 5 is a side sectional view, partly schematic, of another portion of apparatus which embodies the present invention.
Figure 6:
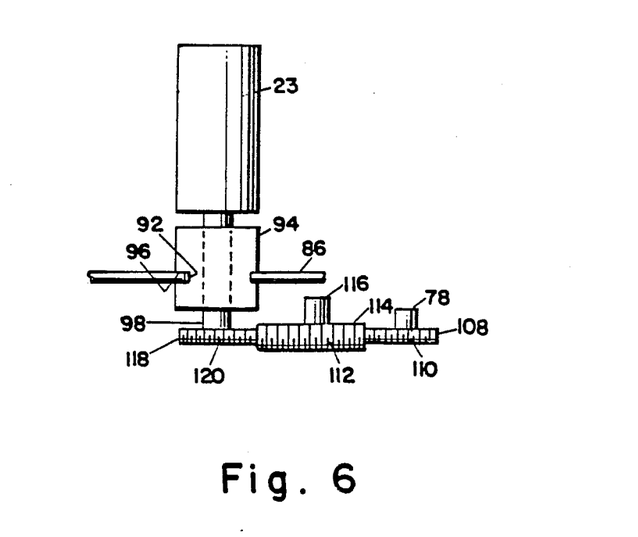
FIG. 6 is a detail view illustrating an aspect of the Present invention.
Figure 7:
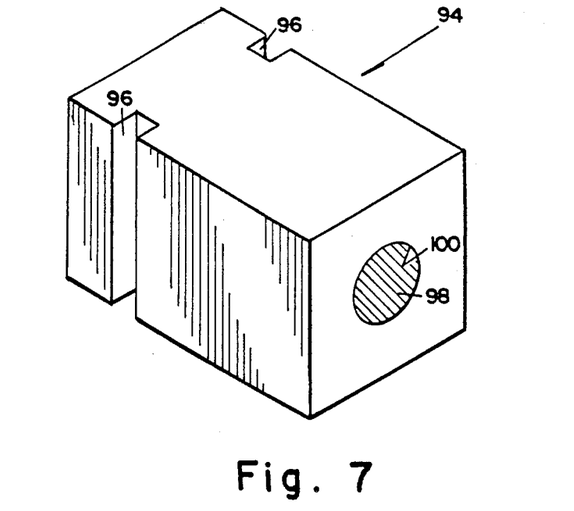
FIG. 7 is a perspective view of the bearing block shown at 94 in FIG. 6.

Referring to FIG. 5, there is shown a bracket 138 to which are mounted the shafts 28 for conveyor rolls 30 and including a separator member 140 providing structural support between the bracket 138 and a similar bracket in which the other ends of the shafts 28 are mounted. Rotatably mounted to bracket 138 at shaft 142 is a lever or bar 144 on which are mounted by suitable means such as shafts 152 two smear rolls 146 for engaging the lower surface of the lower of the hot laminating rolls 24, shown schematically in FIG. 5, preferably one smear roll on each side of the laminating roll axis 27 as shown, for spreading any fluid 124 therefrom over the surface thereof so that it will evaporate from the heat during lamination and not fall onto the dry film where it may interfere with its attachment to transfer plates (not shown). The outer surfaces of the smear rolls 146 may be composed of a similar material to that of cover 122. The smear rolls 146 are urged against the lower of the hot laminating rolls 24 by spring 148 which is attached by suitable means such as screw 150 between the opposite end of the bar 144 and a suitable point on the bracket 138.

Figure 17:
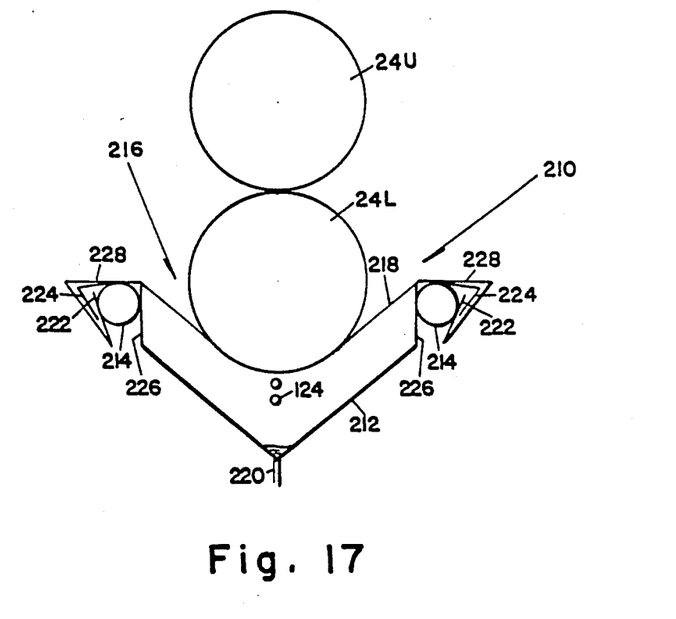
FIG. 17 is a diagrammatic view of an alternative embodiment of the portion of the apparatus shown in FIG. 5.

Referring to FIG. 17, there is shown at 210 an alternative means for spreading the excess fluid 124 which is on the lower 24L of the laminating rolls 24L and 24U evenly over the surface thereof. The upper roll is illustrated at 24U. A drip or catch pan 212 having an inlet 216 is suitably disposed under the lower roll 24L. Cheese cloth 218 or other suitable cloth material which is sufficiently porous to suitably allow the passage of the fluid 124 therethrough is stretched across the inlet 216 to engage the lower surface of the lower roll 24L to allow fluid 124 to drain through the cloth 218 into the drip pan 212, where it may then be drained through drains 220 at either end and either discarded or returned to the system, and to allow any remainder of the fluid to spread more evenly over the surface of the lower roll 24L to facilitate rapid evaporation of the remaining fluid. Each side of the pan 212 is configured in a generally inverted U-shape having a generally vertical body portion 226, a horizontal portion 228, and a generally vertical edge portion 224 which configuration is suitably sized to tightly receive tubes 214. The side portions 222 of the cloth material 218 are wedged or held between respective tubes 214 and respective edge portions 224 of the pan 212. The tubes 214 are sufficiently flexible to be wedged between the respective pan edge portions 224 and body portions 226. For example, the tubes 214 may be polyvinyl or polyurethane tubing. The U-shaped portions of the pan 212 comprising portions 224, 228, and 226 extend beyond the laminating rolls 24 at both ends to points where they are attached to the laminating machine 10 by any suitable means using principles commonly known to those of ordinary skill in the art to which this invention pertains.

Figure 8:
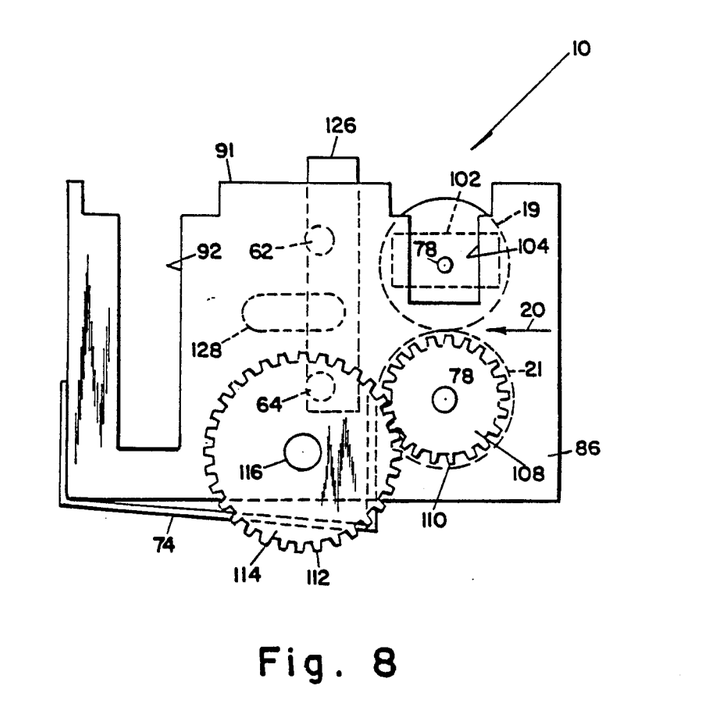
FIGS. 8 to 11 are detail end views, partly in schematic, of the portion of the apparatus of FIG. 2 which contains panel insertion rollers 19, 21, 22, and 23 and which sequentially illustrates a method of converting between dry and wet lamination in accordance with the present invention.
Figure 12:
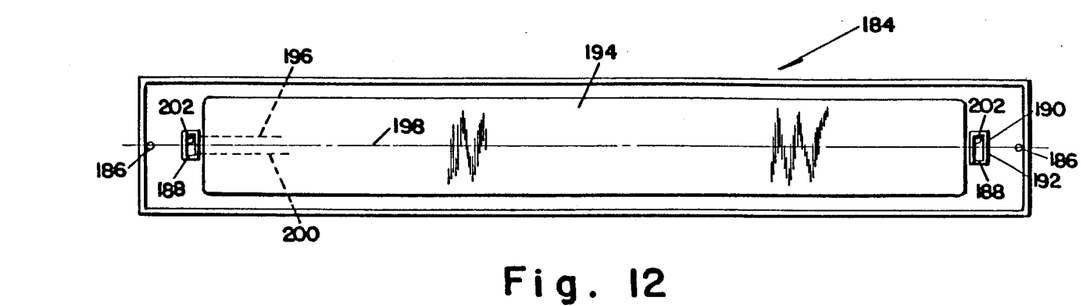
FIG. 12 is a plan view of the cover shown at 184 in FIG. 11.

Referring to FIGS. 11 and 12, a cover 184, preferably having a see-through glass central portion 194 composed of a suitable material such as acrylic for protective and monitoring purposes, is snapped into place over the pinch and insertion rollers 19, 21, 22, and 23 and yoke 126 and attached to the brackets 84 and 86 by suitable fastening means such as screws 186. The yoke 126 is locked into position by means of slotted apertures 188 at each end of the cover 184 which receives screws 202 which threadedly engage respective threaded apertures 204 in the yoke 126. The cover 184 being fixed in position by screws 186, the position of the yoke 126 is adjustable within the narrow portion 192 of the slotted aperture 188 between position 200 adjacent the insertion rollers 22 and 23, as shown in FIG. 11, and position 198 away from the insertion rollers 22 and 23 but also out of the way of the pinch roller 19 and 21, as shown in FIG. 8. Positions 198 and 200 as well as position 196 actually represent positions of the yoke apertures 204 relative to the cover 184. In order to precisely position the yoke 126 in position 200 for wet laminating, the yoke 126 is moved, relative to the cover 184 with the screws 202 loosened in the slotted apertures 188 and threadedly engaging apertures 204, as far as the slotted aPertures 188 will allow, with all the while the yoke 126 being guided along slots 128 by guide screws 206, then the screws 202 are tightened to lock the yoke 126 in position. A portion 190 of each slotted aperture 188 is large enough for the passage of the head of the respective screw 202 therethrough so that the cover 184 may be easily lifted away from the yoke when the yoke is in position 196 and easily re-attached to the yoke.

Figure 14:
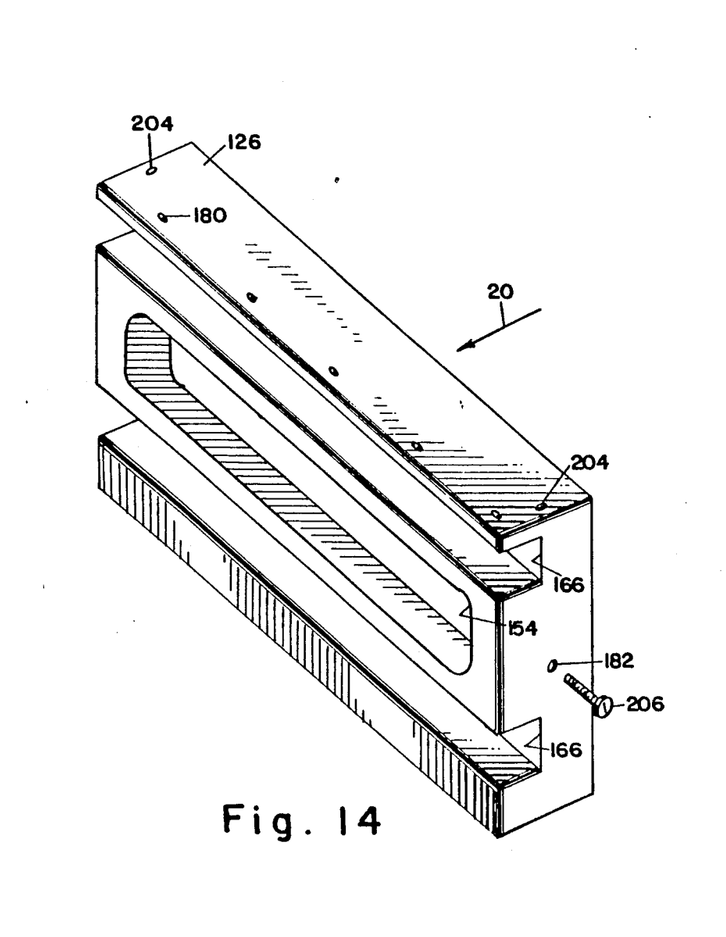
FIG. 14 is a perspective view of the yoke shown at 126 in FIGS. 8 to 11.

For dry lamination, the yoke 126 should be in the position shown in FIG. 8 and illustrated at 198 in FIG. 12 removed from the slot 92 where the insertion rolls 22 and 23 are locatable. The yoke 126 is movable along slots illustrated schematically at 128 in FIGS. 8 to 12 in brackets 84 and 86 between the positions shown in FIGS. 8 and 11 and illustrated schematically at 198 and 200 in FIG. 12. The yoke 126 is guided along slots 128 by means of guide screws, shown at 206 in FIG. 14, which pass through slots 128 and are threadedly inserted in threaded apertures 182 in the yoke 126. The position 196 of the yoke away from the slots 92 permits more room in the area of the slots 92 for removing and replacing rollers. With the yoke 126 in the position shown in FIG. 8 and with the cover 184 removed, the dry insertion rollers 22D and 23D may be lifted one at a time from the slots 92.

As shown in FIG. 9, for wet lamination, the lower wet insertion roller 23W may then be inserted or lowered into the slots 92 with the edges of the slots received in the respective grooves 96 of the bearing blocks 94 to the bottom of the slots 92 with gear teeth 120 self-engaging the gear teeth 112 of the idler or driving gear 114.

Figure 10:
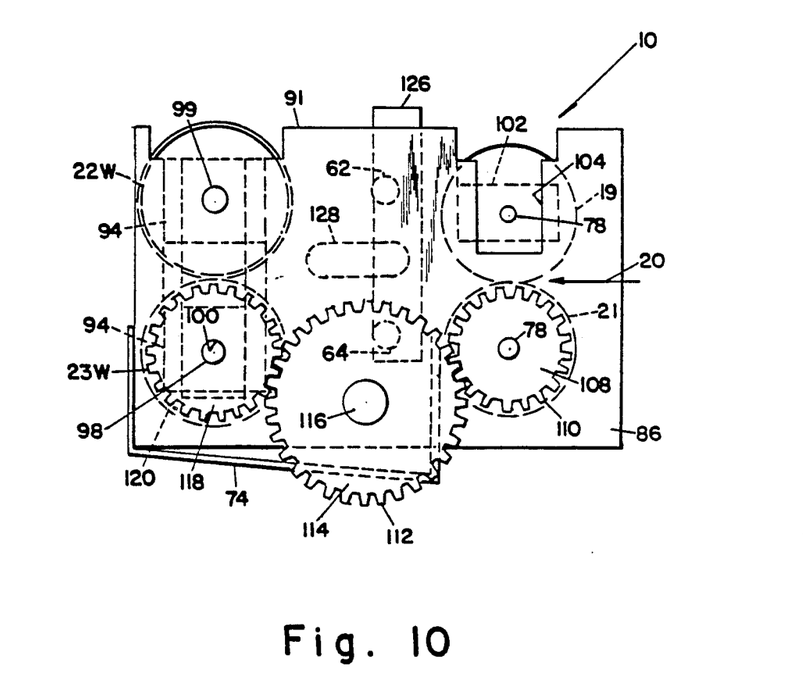

As shown in FIG. 10, the upper wet insertion roller 22W is also inserted in the slots 92 with the edges thereof received in the grooves 96 of the bearing blocks 94 to float or rest by gravity on the lower wet insertion roller 23W.

As shown in FIG. 11, the yoke 126 is then positioned at position 200 adjacent the wet insertion rollers 22W and 23W and the cover 184 locked in position. This is achieved by passing the heads of screws 202, which engage threaded apertures 204 in the yoke 126, through the enlarged portions 190 of the slotted apertures 188 of cover 184, then moving the cover 184 relative to the yoke 126 so that the screws 202 engage the narrow portion 192 of the slotted aperture 188 and are moved to position 200 afterwhich the screws 202 are tightened to fix the position of the yoke 126 relative to the cover 184. The cover 184 is then snapped into position and locked in place by screws 186. Alternatively, the cover 184 may first be locked in place and then the position of the yoke 126 adjusted. Thus, the apparatus 10 is easily and quickly converted from dry laminating to wet laminating without the use of special tools or disassembly of parts and with little or no down time. The apparatus 10 may similarly be converted back to dry laminating by loosening screws 202, moving the yoke 126 to position 196, removing the cover 184, replacing rollers 22W and 23W with rollers 22D and 23D, replacing the cover 184, moving the yoke to position 198, and tightening screws 202. The cover 184 should leave preferably about ¼th of an inch for clearance for thick panels.

As shown in FIG. 16, the dry insertion rollers 22D and 23D may be quickly and easily removed and replaced by wet insertion rollers 22W and 23W, after cover 184 is removed, by lifting them, with the respective bearing blocks 94 and driven gear 118 attached, up and out of the slots 92 and lowering the wet insertion rollers 22W and 23W, with the respective bearing blocks 94 and driven gear 118 attached, in the slots 92 so that the teeth of the driven and driving gears 118 and 114 respectively mesh and re-positioning the yoke 126 and cover 184 with a minimum of down-time.

The fluid used in wet lamination is found to have a very significant bearing upon the aging and adhesion characteristics of the dry film photoresist subsequent to its application to a substrate surface. In many circuit shops, the process steps are not necessarily proximal in time, and the resist may remain on the substrate for anywhere from eight hours to three weeks or longer. The adhesion of the resist may increase within a day or so to the point that a condition is reached that is commonly referred to as "lock-in". This means that the resist can no longer be entirely developed or stripped from the circuit boards which in subsequent steps could lead to copper adhesion failure in plating or shorts in an etching application. In present day dry film photoresists, such as Laminar ® HG, TR or ML, sold by Dynachem Division of Morton Thiokol, Inc., the resist is finely balanced chemically to prevent such lock-in for a period of time as long as four weeks under yellow light conditions. However, it has been found that when using such dry films in a wet laminating process, the use of commonly used wetting agents, such as water, upset this fine balance that existed in the Laminar ® dry film photoresists and also in other resists tested. As a result, lock-in would set in within 24 hours.

In accordance with one aspect of the present invention, it is found that a dilute aqueous solution of a heterocyclic compound which acts as a metal-chelating agent, particularly a copper-chelating agent, as the wetting agent, i.e., the fluid 124 applied to rollers 22W and 23W, prevents lock-in of the photoresist layer. In addition, such solutions prevent oxidation of copper surfaces. Suitable heterocyclic metal-chelating agents include thiazoles, such as benzothiazole and 2-mercaptobenzothiazole; imadazoles, such as methylimidazole; oxazoles, such as 4H-oxazol-5-one; benzopyrazoles, such as indazole; and mixtures thereof. The concentration of the heterocyclic metal-chelating agent may vary over a relatively wide range, solutions of between about 0.1 wt. % and about 10 wt. % of the heterocyclic metal-chelating agent being useful in the wet laminating process.

Presently preferred metal-chelating agents for use as the wetting agent are benzotriazole and substituted benzotriazoles. Benzotriazole and suitable substituted benzotriazoles are described, for example, in U.S. Pat. No. 4, 268, 610. May 19, 1981 to Leo Roos and U.S. Pat. No. 3,622,334, Nov. 23, 1971 to Matawan et al. The teachings of these patents are incorporated herein by reference.

Benzotriazole and substituted benzotriazoles have very low solubilities in water, and to provide a sufficient concentration of a benzotriazole in aqueous solution, it is generally necessary to neutralize the benzotriazole with at least a molar equivalent of an acid. (One mole of a monobasic acid is equivalent to one mole of benzotriazole.) It is known, for example, to use benzotriazole as a HCl salt solution for use in the protection of boilers. Although strong acids, such as HCl, may be used to neutralize benzotriazole in certain printed circuit manufacturing processes, low strength acids are preferable. The acid used to neutralize the benzotriazole or substituted benzotriazole should be selected to minimize attack of metals used in construction of the laminator. Thus acids that have a pH of 2.0 or higher at a 0.1N concentration are preferred for neutralizing benzotriazole or substituted benzotriazole. Suitable acids include, but are not limited to acetic acid, oxalic acid, tartaric acid and boric acid.

It is surprising that solutions of benzotriazole or substituted benzotriazole can be used in a wet lamination process to prevent lock-in of the photoresist layer. Benzotriazole and substituted benzotriazoles have previously been added to photoresist formulations useful in dry lamination processes for the purpose of promoting instant adhesion of the photoresist to copper substrates. These adhesion promoters improve the adhesion characteristics not only directly after lamination (instant adhesion), but also improve the bonding to the substrate surface, allowing the resist to undergo various processing steps without lifting of the resist form the substrate surface. However, because of the improved adhesion, lock-in tends to occur earlier. Thus, whereas benzotriazole or substituted benzotriazole added into a photoresist that is applied by dry lamination promotes lock-in, aqueous solution of benzotriazole or substituted benzotriazole used as a wetting solution in a wet laminating process acts to prevent lock-in.

The efficacy of a benzotriazole solution in preventing lock-in is illustrated in the following Example.

EXAMPLE I

A solution was prepared as follows:

| | |
|---|---|
| Deionized Water | 695.0 g |
| Citric Acid | 84.0 g |
| Benzotriazole | 7.6 g |

100 g of this solution were diluted with 900 g deionized water and recirculated through the wet laminating apparatus. Several scrubbed double sided 1 oz. copper-clad boards were then sent through the apparatus and then laminated, while wet, with Laminar ® TR. Similarly, several controls using just deionized water were prepared in similar fashion. These boards were kept in a dark environment and on a daily basis a control and boards laminated with Laminar ® TR were developed in an aqueous Chemcut Model #547 containing a 1% weight $Na_2CO_2 \cdot H_2O$ at 85° F. (29° C.). Speed was set to give a 2x breakpoint.

RESULTS

Day 1. Control and TR both developed clean
Day 2. Control developed minor residue. TR was clean
Day 3. Control had severe residue, TR was clean
Day 7. TR had minor residue It is to be understood that the invention is by no means limited to the specific embodiments which have been illustrated and described herein and that various modifications thereof may indeed be made which come within the scope of the present invention as defined by the appended claims.

Subject matter disclosed but not claimed herein is disclosed and is being claimed in Application Ser. No. 07/375,410, filed June 30, 1989, which application is a continuation-in-part of the present application.

What is claimed is:

1. Apparatus comprising means for laminating a photopolymerizable film onto at least one surface of a substrate and means for applying fluid to the at least one substrate surface before laminating a photopolymerizable film thereon, said fluid applying means comprising a pair of upper and lower parallel elongate roller means for engaging and passing the substrate horizontally therebetween, fluid absorbent means on said roller means for applying fluid to the at least one substrate surface as the substrate is passed horizontally between the roller means, means for applying fluid to said fluid absorbent means, a pair of end portions comprising first and second shaft portions on each of said roller means, a bearing means in which each said shaft portion is rotatably engaged, means for supportively housing each of said bearing means, means including a driven gear on one of said shaft portions on at least one of said roller means and a driving gear which meshes with said driven gear for rotating said at least one of said roller means whereby rotation of both roller means may be effected to pass the substrate therebetween, said housing means comprising first and second support members each having an upper surface and means defining a vertically extending slot in said upper surface for receiving said bearing means for said first and second shaft portions, respectively, of said roller means, the axis of said driving gear being lower than the axis of said driven gear whereby the roller means may be removed by lifting the roller means with the bearing means and driven gear attached thereto vertically out of the slot means.

2. Apparatus according to claim 1 wherein said bearing means comprises a bearing block which includes a pair of groove means for receiving edge portions of said slot means whereby the bearing block may be precisely positioned as it is lowered in the slot means.

3. Apparatus according to claim 1 wherein said fluid supply means comprises an elongate tubular means disposable parallel to and adjacent each of said roller means for receiving fluid to be applied to said fluid absorbent means on each said respective roller means and a plurality of aperture means spaced over the length of said tubular means for releasing the fluid onto said respective fluid absorbent means.

4. Apparatus according to claim 3 wherein said fluid supply means further comprises a housing member for both of said tubular means, said housing member adjustable between a first position wherein each said tubular means is adjacent said respective roller means and a second position wherein each said tubular means is spaced from said respective roller means a greater distance than when said housing member is in said first position.

5. Apparatus according to claim 4 further comprising at least one wiper means on said housing member which wiper means extends from said housing member to engage said fluid absorbent means on a respective one of said roller means for distributing the fluid evenly over the surface of said fluid absorbent means.

6. Apparatus according to claim 1 wherein said means for laminating comprises a pair of laminating rolls, the apparatus further comprises at least one smear roll means for engaging one of said laminating rolls for evenly distributing over the surface thereof excess fluid removed onto said laminating roll from the substrate and means for urging said at least one smear roll means against said laminating roll.

7. Apparatus according to claim 1 wherein said means for laminating comprises an upper and a lower superposed roll, the apparatus further comprises means for distributing over the surface of said lower roll excess fluid received thereon from the at least one substrate surface, said distributing means comprises a pan means having an inlet means disposed below said lower roll for collecting drips of fluid therefrom and a cloth member disposed across said inlet means in engagement with said lower roll, said cloth member being porous to allow passage of fluid from said lower roll therethrough to be collected in said pan means.

8. Apparatus according to claim 1 further comprising means for controlling the rate of fluid flow to said roller means.

9. Apparatus according to claim 8 further comprising means for filtering and recirculating excess fluid supplied to said roller means.

10. Apparatus according to claim 8 wherein said control means comprises a constant pressure pump, a pump discharge line which divides into a branch for each of said roller means, a restrictive passage in each said branch, and a by-pass means downstream of each respective restrictive passage for regulating the flow rate of fluid to the respective roller means.

11. Apparatus comprising means for laminating a photopolymerizable film onto at least one surface of a substrate, roller means including fluid absorbent means for applying fluid to the at least one substrate surface before laminating a photopolymerizable film thereon, means for supplying fluid to said roller means, means for filtering and recirculating excess fluid supplied to said roller means, and means for controlling the rate of fluid flow to said roller means, wherein said means for laminating comprises a pair of laminating rolls, the apparatus further comprises at least one smear roll means for engaging one of said laminating rolls for evenly distributing over the surface thereof excess fluid removed onto said laminating roll from the substrate and means for urging said at least one smear roll means against said one of said laminating rolls.

12. Apparatus comprising means for laminating a photopolymerizable film onto at least one surface of a substrate, roller means including fluid absorbent means for applying fluid to the at least one substrate surface before laminating a photopolymerizable film thereon, means for supplying fluid to said roller means, means for filtering and recirculating excess fluid supplied to said roller means, and means for controlling the rate of fluid flow to said roller means, wherein said means for laminating comprises an upper and lower superposed roll, the apparatus further comprises means for distributing over the surface of said lower roll excess fluid received thereon from the at least one substrate surface, said distributing means comprises a pan means having an inlet means disposed below said lower roll for collecting drips of fluid therefrom and a cloth member disposed across said inlet means in engagement with said lower roll, said cloth member being porous to allow passage of fluid from said lower roll therethrough to be collected in said pan means.

13. Apparatus comprising means including an upper and a lower superposed roll for laminating a photopolymerizable film onto at least one surface of a substrate, means for applying fluid to the at least one substrate surface before laminating a photopolymerizable film thereon, and means for distributing over the surface of said lower roll excess fluid received thereon from the at least one substrate surface whereby the excess fluid received thereon may be evaporated by the heat of lamination.

14. Apparatus according to claim 13 wherein said distributing means comprises a pan means having an inlet means disposed below said lower roll for receiving drips of fluid therefrom and a cloth member disposed across said inlet means in engagement with said lower roll, said cloth member being porous to allow passage of fluid from said lower roll therethrough to be collected in said pan means.

15. Apparatus according to claim 14 further comprises a pair of flexible support tubes wedged between respective edge portions and respective body portions of said pan means, said cloth member having edge portions which are held between said respective support tubes and said respective pan edge portions.

16. Apparatus according to claim 13 wherein said distributing means comprises at least one smear roll means for engaging said lower laminating roll and means for urging said smear roll means against said lower laminating roll.

17. Apparatus according to claim 16 wherein said distributing means comprises two of said smear roll means on respectively opposite sides of the center of said lower laminating roll.

* * * * *